(12) United States Patent
Neto

(10) Patent No.: US 10,790,847 B1
(45) Date of Patent: Sep. 29, 2020

(54) DEVICE FOR HIGH-SPEED DIGITAL-TO-ANALOG CONVERSION

(71) Applicant: Xilinx, Inc., San Jose, CA (US)

(72) Inventor: Pedro W. Neto, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/525,982

(22) Filed: Jul. 30, 2019

(51) Int. Cl.
*H03M 1/66* (2006.01)
*H03M 1/46* (2006.01)

(52) U.S. Cl.
CPC .......... *H03M 1/466* (2013.01); *H03M 1/462* (2013.01)

(58) Field of Classification Search
CPC ......... H03M 1/466; H03M 1/462; H03M 1/00
USPC ................................................. 341/150, 172
See application file for complete search history.

(56) References Cited

U.S. PATENT DOCUMENTS

| | | | | |
|---|---|---|---|---|
| 5,334,889 | A * | 8/1994 | Hisaka | H03K 19/00361 326/21 |
| 7,821,441 | B2 * | 10/2010 | Westwick | H03M 1/002 341/155 |
| 7,944,379 | B2 | 5/2011 | Ohnhaeuser et al. | |
| 8,390,501 | B2 | 3/2013 | Chang et al. | |
| 8,754,626 | B2 * | 6/2014 | Miller | H02M 3/1588 323/288 |
| 8,970,419 | B2 | 3/2015 | Farley et al. | |
| 9,362,931 | B2 * | 6/2016 | Yamamoto | H03M 1/002 |
| 9,503,058 | B1 | 11/2016 | Cical et al. | |
| 9,831,875 | B2 * | 11/2017 | Reddy | H03K 19/00361 |
| 10,135,275 | B2 * | 11/2018 | Kinzer | H02M 3/157 |
| 10,236,901 | B1 | 3/2019 | Neto | |
| 10,386,882 | B2 * | 8/2019 | Kesarwani | H02M 3/158 |
| 10,530,169 | B2 * | 1/2020 | Kinzer | H03K 3/356017 |
| 2011/0309812 | A1 * | 12/2011 | Miller | H02M 3/1588 323/284 |
| 2012/0182067 | A1 * | 7/2012 | Prasad | H03G 1/0094 330/7 |
| 2013/0002223 | A1 * | 1/2013 | Xi | H02M 3/158 323/284 |

(Continued)

OTHER PUBLICATIONS

Bob Verbruggen, Masao Iriguchi, and Jan Craninckx, A 1.7 mW 11b 250 MS/s 2-Times Interleaved Fully Dynamic Pipelined SAR ADC in 40 nm Digital CMOS, IEEE Journal of Solid-State Circuits, Dec. 2012, 8 pages, vol. 47, No. 12, San Francisco, CA, USA.

(Continued)

*Primary Examiner* — Jean B Jeanglaude
(74) *Attorney, Agent, or Firm* — Patterson + Sheridan, LLP

(57) ABSTRACT

Apparatus and associated methods relate to unit circuits that having a number of capacitors and/or buffers controlled by two different control signals, capacitors and/or buffers that receiving, through routing, a same control signal from a control circuit are physically placed adjacent without crossing routings that connects capacitors and/or buffers controlled by a different control signal. In an illustrative example, a first capacitor may be configured to receive a first control signal through an inverting buffer, and a second capacitor may be configured to receive the first control signal through a non-inverting buffer, the inverting buffer and the non-inverting buffer may be provided by an integrated buffer structure. By arranging the physical positions of the capacitors and/or buffers, wire capacitances of the unit circuit may be advantageously reduced.

20 Claims, 9 Drawing Sheets

(56) References Cited

U.S. PATENT DOCUMENTS

| | | | | |
|---|---|---|---|---|
| 2013/0271215 | A1* | 10/2013 | Lang | H03F 1/14 330/251 |
| 2016/0079844 | A1* | 3/2016 | Kinzer | H03K 3/012 323/272 |
| 2016/0079964 | A1* | 3/2016 | Kinzer | H01L 23/49562 327/333 |
| 2017/0077837 | A1* | 3/2017 | Gu | H02M 1/15 |
| 2017/0155391 | A1* | 6/2017 | Kinzer | H01L 27/0248 |
| 2018/0138920 | A1* | 5/2018 | Sharma | H03M 1/1245 |

OTHER PUBLICATIONS

Young-Deuk Jeon, Young-Kyun Cho, Jae-Won Nam, Kwi-Dong Kim, Woo-Yol Lee, Kuk-Tae Hong, and Jong-Kee Kwon, A 9.15mW 0.22mm2 10b 204MS/s Pipelined SAR ADC in 65nm CMOS, IEEE, 2010, 4 pages, San Jose, CA, USA.

Chun-Cheng Liu, Soon-Jyh Chang, Guan-Ying Huang, and Ying-Zu Lin, A 10-bit 50-MS/s SAR ADC With a Monotonic Capacitor Switching Procedure, IEEE Journal of Solid-State Circuits, Apr. 2010, 10 Pages, vol. 45, No. 4, USA.

Samuel Palermo, Sebastian Hoyos, Ayman Shafik, Ehsan Zhian Tabasy, Shengchang Cai, Shiva Kiran, and Keytaek Lee, CMOS ADC-Based Receivers for High-Speed Electrical and Optical Links, IEEE Communications Magazine, Oct. 2016, 8 pages, USA.

Jen-Huan Tsai, Hui-Huan Wang, Yang-Chi Yen, Chang-Ming Lai, Yen-Ju Chen, Po-Chuin Huang, Ping-Hsuan Hsieh, Hsin Chen, and Chao-Cheng Lee, A 0.003 mm2 10 b 240 MS/s 0.7 mW SAR ADC in 28 nm CMOS With Digital Error Correction and Correlated-Reversed Switching, IEEE Journal of Solid-State Circuits, Jun. 2015, 17 pages, vol. 50, No. 6, USA.

Kalmeshwar N. Hosur, Girish V. Attimarad, Harish M. Kittur, and S. S. Kerur, Design and simulation of Low Power Successive Approximation Register for A/D Converters using 0.18um CMOS Technology, International Journal of Engineering and Technology (IJET), May 2016, 9 pages, vol. 8, No. 2, India.

Lukas Kull, Thomas Toifl, Martin Schmatz, Pier Andrea Francese, Christian Menolfi, Matthias Braendli, Marcel Kossel, Thomas Morf, Toke Meyer Andersen, and Yusuf Leblebici, 3.1 mW 8b 1.2 GS/s Single-Channel Asynchronous SAR ADC With Alternate Comparators for Enhanced Speed in 32 nm Digital SOI CMOS, IEEE Journal of Solid-State Circuits, Dec. 2013, 10 Pages, vol. 48, No. 12.

Lukas Kull, Thomas Toifl, Martin Schmatz, Pier Andrea Francese, Christian Menolfi, Matthias Braendli, Marcel Kossel, Thoms Morf, Toke Meyer Andersen, Yusuf Leblebici, A 90GS/s 8b 667mW 64x Interleaved SAR ADC in 32nm Digital SOI CMOS, 2014 IEEE International Solid-State Circuits Conference, 3 pages, San Francisco, CA.

* cited by examiner

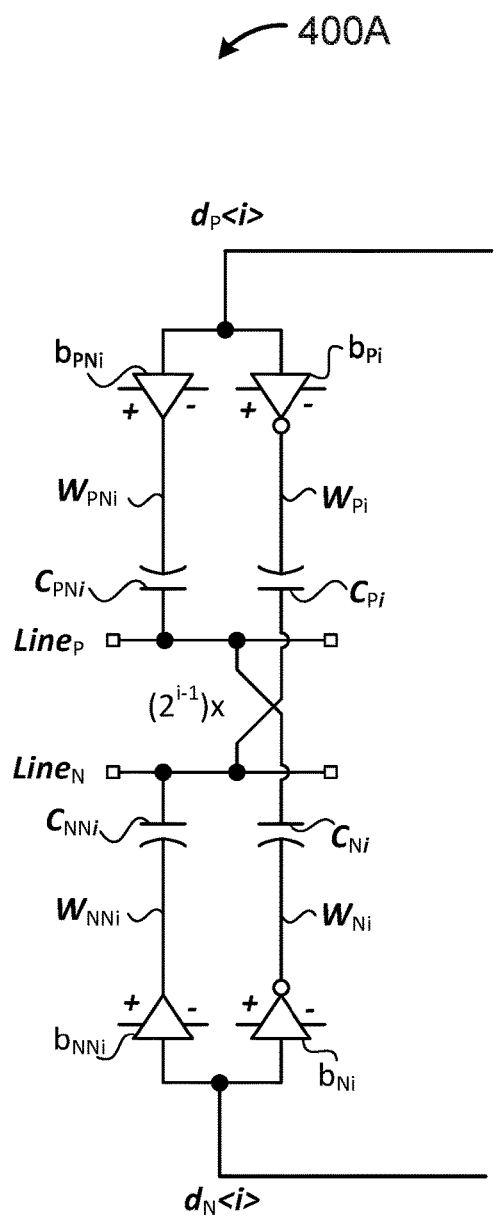
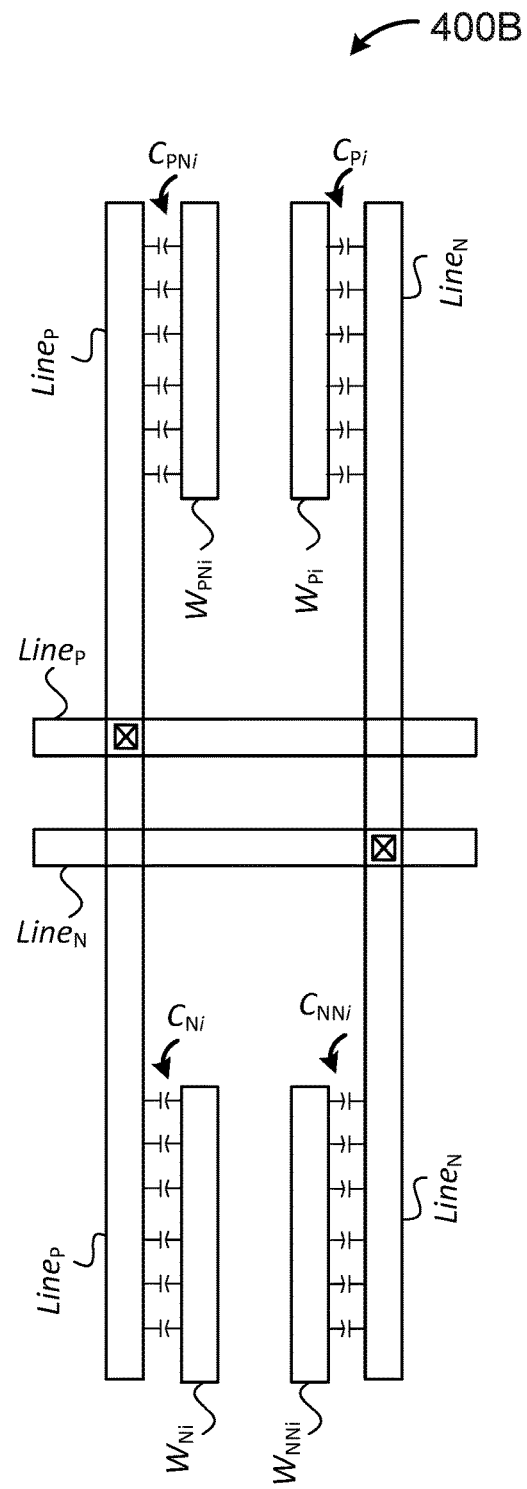
FIG. 4A
FIG. 4B

DEVICE FOR HIGH-SPEED DIGITAL-TO-ANALOG CONVERSION

TECHNICAL FIELD

Various embodiments relate generally to integrated circuits (ICs), and more specifically, to digital-to-analog converters (ADCs).

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space. Some wireless links may transport information in the form of light.

At a receiver in a digital communication system, a digitally-encoded data stream may be received as an analog signal and converted to a digital format by an analog-to-digital converter (ADC). The ADC may interpret the data stream as a function of time. For example, some ADCs may be synchronized to a clock signal that determines when a voltage signal is to be sampled.

SUMMARY

Apparatus and associated methods relate to unit circuits that having a number of capacitors and/or buffers controlled by two different control signals, capacitors and/or buffers that receiving, through routing, a same control signal from a control circuit are physically placed adjacent without crossing routings that connects capacitors and/or buffers controlled by a different control signal. In an illustrative example, a first capacitor may be configured to receive a first control signal through an inverting buffer, and a second capacitor may be configured to receive the first control signal through a non-inverting buffer, the inverting buffer and the non-inverting buffer may be provided by an integrated buffer structure. By arranging the physical positions of the capacitors and/or buffers, wire capacitances of the unit circuit may be advantageously reduced.

Various embodiments may achieve one or more advantages. For example, some embodiments may cause up to 50% reduction on the input wire load of a digital-to-analog converter (DAC) by arranging capacitors controlled by a same signal on a same side of the unit circuit. Thus, a compact CDAC with a smaller footprint (e.g., size) may be made. In addition, advantageously reduced DAC input capacitances may contribute to high-speed SAR ADC implementation. By providing an integrated buffer structure with a speed-boosting device, some embodiments may provide an inverting/non-inverting buffer with a small input capacitance and enhanced speed on non-inverting path. Some embodiments may keep inputs of comparator(s) in an analog-to-digital converter (ADC) substantially constant to reduce kickback noises by introducing double-DAC structure in the ADC.

Some embodiments may provide a unit quad-cell (circuit) based design, allowing for optimization of delays, differential voltage generation and common mode variation strategy at the unit circuit level. In some embodiments, modular unit circuits may make impairments evenly distributed through the array, and layout of the modular unit circuit may be implemented by abutment to improve accuracy and timing performances. In some embodiments, capacitive quad structure with parallel buffer output bars (e.g., $W_{PNi}$, $W_{Pi}$, $W_{Ni}$, $W_{NNi}$) may be surrounded by output lines (e.g., $Line_P$, $Line_N$) to reduce or minimize unintentional coupling between the buffer output bars and the output lines. In some embodiments, output lines (e.g., $Line_P$, $Line_N$) may be shared by adjacent unit circuits to provide a compact layout and a compact DAC. In some embodiments, a DAC may be modified to include capacitance mismatch calibration to enable high-resolution ADC implementations.

In one exemplary aspect, a circuit includes (a) a first capacitor having two terminals, with one terminal coupled to a first conductive path and the other terminal coupled to receive a first control signal from a control circuit, (b) a second capacitor having a first terminal and a second terminal, the first terminal of the second capacitor is coupled to a second conductive path and the second terminal of the second capacitor is connected to a terminal of a first inverting buffer, the other terminal of the first inverting buffer is coupled to receive the first control signal from the control circuit, (c) a third capacitor having two terminals, with one terminal coupled to the second conductive path and the other terminal coupled to receive a second control signal from the control circuit, and, (d) a fourth capacitor having a first terminal and a second terminal, the first terminal of the fourth capacitor is coupled to the first conductive path and the second terminal of the fourth capacitor is connected to a terminal of a second inverting buffer, the other terminal of second inverting buffer is coupled to receive the second control signal from the control circuit. Routings from the control circuit to the first capacitor and the first inverting buffer are routed without crossing routings from the control circuit to the third capacitor and the second inverting buffer.

In some embodiments, the first capacitor may be configured to receive the first control signal through a first non-inverting buffer, the first non-inverting buffer may be physically arranged adjacent to the first inverting buffer. In some embodiments, the first non-inverting buffer and the first inverting buffer may be provided by an integrated buffer circuit, the integrated buffer circuit may include (a) a first complementary metal-oxide-semiconductor inverter coupled to receive the first control signal, (b) a second CMOS inverter coupled to receive the first control signal, and (c) a third CMOS inverter configured to receive an output of the second CMOS inverter.

In some embodiments, the integrated buffer circuit may also include an NMOSFET, a gate terminal of the NMOSFET may be coupled to receive the first control signal, a drain terminal of the NMOSFET may be coupled to a reference voltage, and a source terminal of the NMOSFET may be coupled to an output of the third CMOS inverter. In some embodiments, the second CMOS inverter may have a supply voltage that is greater than a supply voltage of first CMOS inverter. In some embodiments, the size of the third CMOS inverter may be larger than the size of the second CMOS inverter. In some embodiments, the third capacitor may be configured to receive the second control signal through a second non-inverting buffer, the second non-inverting buffer may be physically arranged adjacent to the second inverting buffer. In some embodiments, the second non-inverting buffer and the second inverting buffer may be provided by an integrated buffer circuit.

In another exemplary aspect, a system includes a number of a first type of unit circuits, each first type of unit circuit includes (a) a first capacitor having two terminals, with one terminal coupled to a first conductive path and the other terminal coupled to receive a first control signal from a control circuit, (b) a second capacitor having a first terminal and a second terminal, the first terminal of the second capacitor is coupled to a second conductive path and the second terminal of the second capacitor is connected to a terminal of a first inverting buffer, the other terminal of the first inverting buffer is coupled to receive the first control signal from the control circuit, (c) a third capacitor having two terminals, with one terminal coupled to the second conductive path and the other terminal coupled to receive a second control signal from the control circuit, and, (d) a fourth capacitor having a first terminal and a second terminal, the first terminal of the fourth capacitor is coupled to the first conductive path and the second terminal of the fourth capacitor is connected to a terminal of a second inverting buffer, the other terminal of second inverting buffer is coupled to receive the second control signal from the control circuit. Routings from the control circuit to the first capacitor and the first inverting buffer are routed without crossing routings from the control circuit to the third capacitor and the second inverting buffer.

In some embodiments, the first capacitor may be configured to receive the first control signal through a first non-inverting buffer, the first non-inverting buffer may be physically arranged adjacent to the first inverting buffer. In some embodiments, the first non-inverting buffer and the first inverting buffer may be provided by an integrated buffer circuit, the integrated buffer circuit may include (a) a first CMOS inverter coupled to receive the first control signal, (b) a second CMOS inverter coupled to receive the first control signal, and (c) a third CMOS inverter configured to receive an output of the second CMOS inverter. In some embodiments, the integrated buffer circuit may also include an NMOSFET, a gate terminal of the NMOSFET may be coupled to receive the first control signal, a drain terminal of the NMOSFET may be coupled to a reference voltage, and a source terminal of the NMOSFET may be coupled to an output of the third CMOS inverter. In some embodiments, the second CMOS inverter may be powered by a supply voltage that is greater than a supply voltage of first CMOS inverter. In some embodiments, the third capacitor may be configured to receive the second control signal through a second non-inverting buffer, the second non-inverting buffer may be physically arranged adjacent to the second inverting buffer.

In some embodiments, the system may also include a second type of unit circuit, the second type of unit circuit may include (a) a fifth capacitor having two terminals, with one terminal coupled to the first conductive path and the other terminal coupled to ground, (b) a sixth capacitor having two terminals, with one terminal coupled to the second conductive path and the other terminal connected to a third control signal through a sixth inverting buffer, (c) a seventh capacitor having two terminals, with one terminal coupled to the second conductive path and the other terminal coupled to ground, and (d) an eighth capacitor having two terminals, with one terminal coupled to the first conductive path and the other terminal connected to a fourth control signal through an eighth inverting buffer. The fifth capacitor and the sixth capacitor may be arranged on a same side of the first conductive path, the seventh capacitor and the eighth capacitor may be arranged on a same side of the second conductive path.

In another exemplary aspect, a method includes (a) providing a first capacitor with one terminal coupled to a first conductive path and the other terminal coupled to receive a first control signal from a control circuit, (b) providing a second capacitor with one terminal coupled to a second conductive path and the other terminal connected to one terminal of a first inverting buffer, (c) providing a third capacitor with one terminal coupled to the second conductive path and the other terminal coupled to receive a second control signal from the control circuit, (d) providing a fourth capacitor with one terminal coupled to the first conductive path and the other terminal connected to one terminal of a second inverting buffer, (e) routing the other terminal of the first capacitor and the other terminal of the first inverting buffer to receive the first control signal, and, (f) routing the other terminal of the third capacitor and the other terminal of the second inverting buffer to receive the second control signal without crossing routings from the control circuit to the first capacitor and the first inverting buffer.

In some embodiments, the method may also include physically arranging the first non-inverting buffer adjacent to the first inverting buffer and coupling one terminal of the first capacitor to the first control signal through a first non-inverting buffer. In some embodiments, the first non-inverting buffer and the first inverting buffer may be provided by an integrated buffer circuit, the integrated buffer circuit may include (a) a first CMOS inverter coupled to receive the first control signal, (b) a second CMOS inverter coupled to receive the first control signal, (c) a third CMOS inverter configured to receive an output of the second CMOS inverter.

In some embodiments, the integrated buffer circuit may also include an NMOSFET, a gate terminal of the NMOSFET may be coupled to receive the first control signal, a drain terminal of the NMOSFET may be coupled to a reference voltage, and a source terminal of the NMOSFET may be coupled to an output of the third CMOS inverter. In some embodiments, the second CMOS inverter may be powered a supply voltage that is greater than a supply voltage of first CMOS inverter.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

FIG. 4A depicts one type of an exemplary quad unit circuit implemented in the DAC.

FIG. 4B depicts an exemplary layout of wires in the second type of quad unit circuit.

Like reference symbols in the various drawings indicate like elements.

DETAILED DESCRIPTION OF ILLUSTRATIVE EMBODIMENTS

Apparatus and associated methods relate to unit circuits that having a number of capacitors and/or buffers controlled by two different control signals, capacitors and/or buffers that receiving, through routing, a same control signal from a control circuit are physically placed adjacent without crossing routings that connects capacitors and/or buffers controlled by a different control signal. In an illustrative example, a first capacitor may be configured to receive a first control signal through an inverting buffer, and a second capacitor may be configured to receive the first control signal through a non-inverting buffer, the inverting buffer and the non-inverting buffer may be provided by an integrated buffer structure. By arranging the physical positions of the capacitors and/or buffers, wire capacitances of the unit circuit may be advantageously reduced.

To aid understanding, this document is organized as follows. First, an exemplary platform (e.g., an FPGA) suitable to perform data communication and signal conversion is briefly introduced with reference to FIG. 1. Second, with reference to FIGS. 2-5, the discussion turns to exemplary embodiments that illustrate schematics of a digital-to-analog converter (DAC) useful for digital conversion in a successive-approximation-register (SAR) analog-to-digital converter (ADC). Then, with reference to FIG. 6, an exemplary integrated buffer circuit used in the DAC is discussed. Finally, with reference to FIG. 7, another exemplary platform (e.g., a system-on-Chip (SOC)) suitable to perform data communication and signal conversion is briefly introduced.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Figure 1:
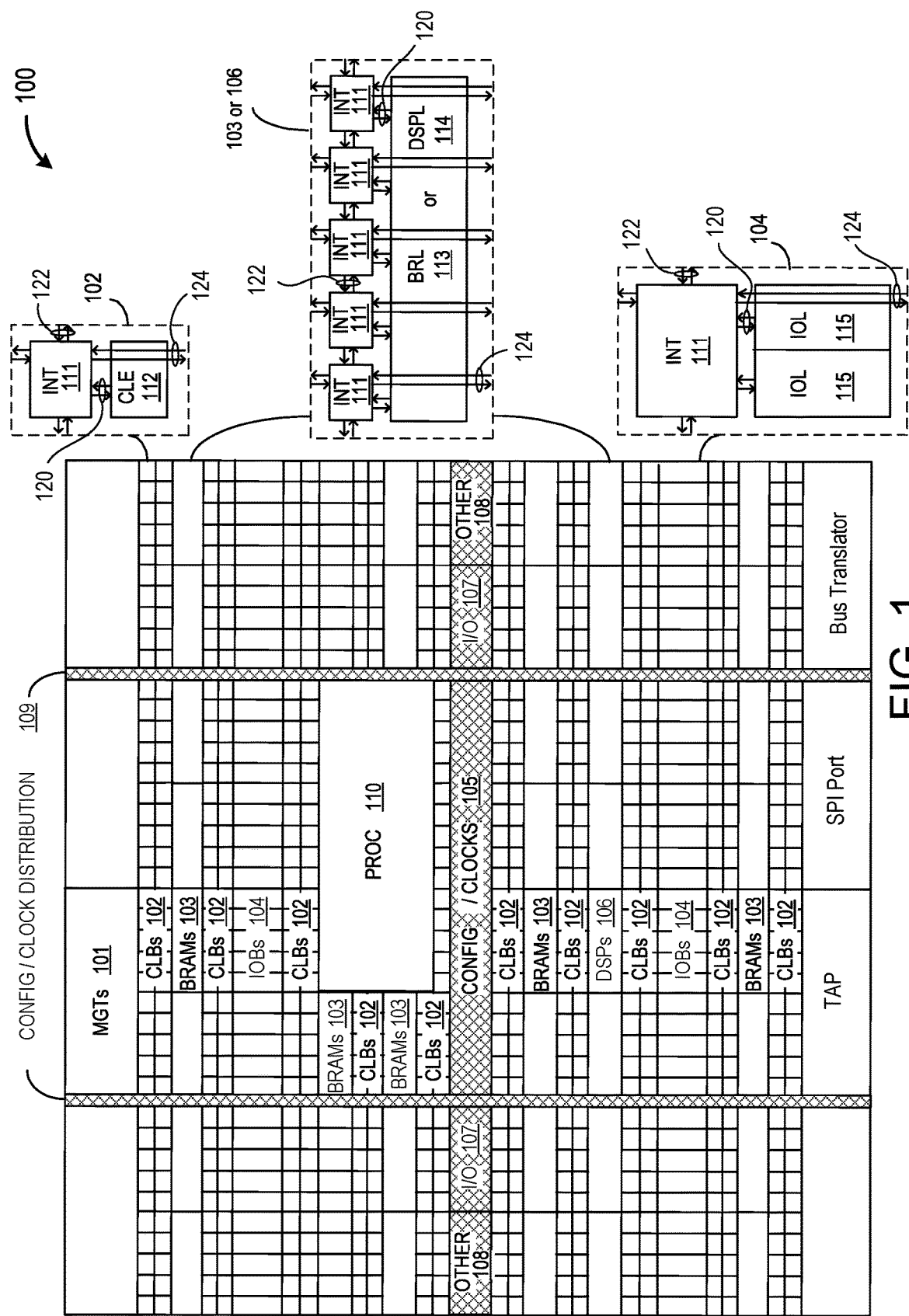
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System-on-Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/ logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA) may be used in a communication system to support various data communication protocols over wide frequency ranges while using progressively smaller areas. In various examples, analog signal levels may be converted into digital voltages, digital currents or digital charge signals using an analog-to-digital converter (ADC). Successive-approximation-register (SAR) ADC is a type of ADC that converts a continuous analog waveform into a discrete digital representation via a, for example, binary search through all possible quantization levels before finally converging upon a digital output for each conversion.

Figure 2:
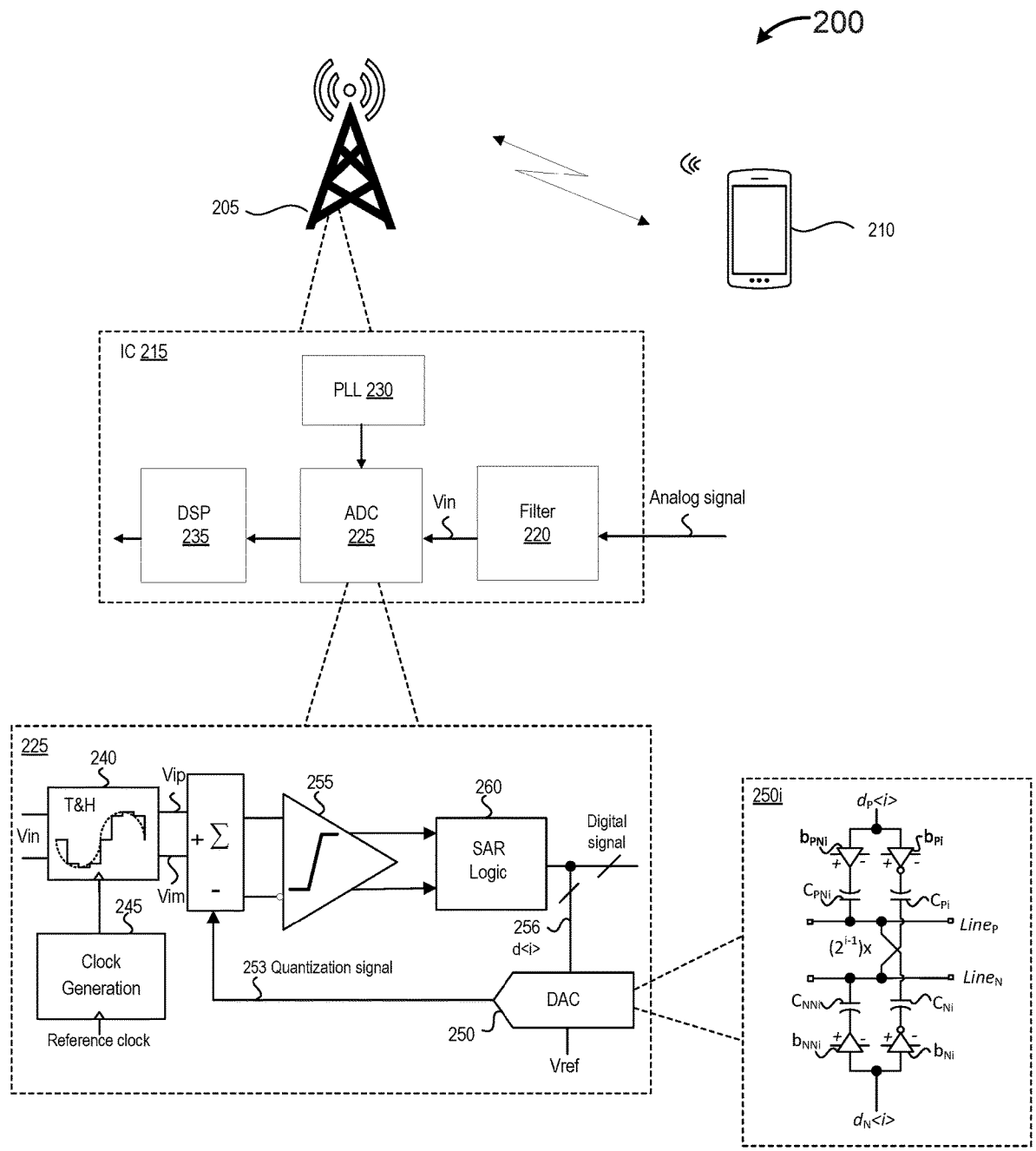
FIG. 2 depicts an analog-to-digital converter (ADC) having an exemplary digital-to-analog converter (DAC) implemented in an IC.

FIG. 2 depicts an analog-to-digital converter (ADC) having an exemplary digital-to-analog converter (DAC) implemented in an IC. In this depict example, a communication system 200 includes a base station 205 to transmit and/or receive data from some data communication devices. In this exemplary example, the base station 205 receives an analog signal from a portable communication device 210 (e.g., cell phone). The base station 205 includes an integrated circuit (IC) 215 performing data communications through an antenna (not shown) between the base station 205 and the cell phone 210. For example, IC 215 includes a filter (e.g., a low-pass filter) 220 to filter noises in the analog signal. An analog-to-digital converter (ADC) 225 may sample and convert the filtered analog signal into a digital signal. The sampling and conversion may be controlled by different clock signals. A phase-locked-loop (PLL) 230 may be used to provide the clock signals. The digital signal may be then processed by a digital signal processor (DSP) 235, for example.

In this illustrative example, the ADC 225 is a SAR ADC where output code (e.g., the digital signal) of the ADC is defined during a number of successive approximation cycles (SA cycles). The SAR ADC 225 includes a track and hold (T&H) circuit 240 used to perform a sample and hold operation on a differential incoming signal Vin (e.g., the filtered analog signal) to generate a differential sampled signal during a sample stage. A clock generation circuit 245 may be used to generate sampling clock signals for the track and hold circuit 240. The SAR ADC 225 also includes an n+1 bit digital-to-analog converter (DAC) 250 to generate a quantization signal 253 according to switch control signals d<i> 256, n≥0.

The SAR ADC 225 also includes a comparator system 255. In some embodiments, the comparator system 255 may include one or more differential dynamic comparators. In some embodiments, the clock generation circuit 245 may also generate clock signals for the one or more differential dynamic comparators in the comparator system 255. For example, when the comparator system 255 includes two differential dynamic comparators, the clock generation circuit 245 may generate two asynchronous clock signals to dynamically enable one of the two comparators at a rising edge of a corresponding clock signal.

The comparator system 255 may selectively enable one or more (e.g., 2, 3, 4, . . . 7, 8, for example) differential dynamic comparators to compare the sampled signal with the quantization signal 253 to generate, for example, a differential comparison signal to a successive-approximation-register (SAR) logic circuit 260. The SAR logic circuit 260 may be used for successively changing the content of the switch control signals d<i> 256 during a voltage comparison stage to vary the quantization signal 253, enabling the next SA cycle and stop the conversion cycle after the last conversion, and successively receiving the differential comparison signal to generate a digital output signal.

In some embodiments, the DAC 250 may be a differential input charge redistribution capacitive DAC (CDAC) to help mitigate effects of common mode noise and coupling on high-speed operation. In each SA cycle, the difference between a sampled input and the internal DAC 250 output may be compared against zero. If the difference is positive, a bit one may be attributed to the correspondent SA cycle, and the DAC 250 may increase its output magnitude. If the difference is negative, the corresponding SA cycle bit may be zero and the DAC 250 output magnitude may be reduced.

The DAC 250 may include n+1 quad unit circuits to form the DAC 250. Each of the n+1 quad unit circuits (e.g., an $i^{th}$ unit circuit 250*i*) includes several capacitors (e.g., $C_{PNi}$, $C_{Pi}$, $C_{NNi}$, $C_{Ni}$) arranged between a differential DAC output line (e.g., a first differential DAC output line Line$_P$, a second differential DAC output line Line$_n$) and control buffers (e.g., control buffers $b_{PNi}$, $b_{Pi}$, $b_{NNi}$, $b_{Ni}$). Examples of different DAC architectures are described in further detail with reference to FIG. 3A. The switch control signals d<i> 256 may be used to control the unit circuits to change DAC 250 output magnitude. More specifically, the switch control signals d<i> 256 (e.g., having a positive control signal $d_P$<i> and a negative control signal $d_N$<i>) may be to control switches connected with the capacitors in the corresponding unit circuit, n≥i≥0.

As shown in FIG. 2, capacitor $C_{PNi}$ and capacitor $C_{Pi}$ are controlled by the positive control signal $d_P$<i> and are arranged on one side of the first differential DAC output line Line$_P$. Capacitor $C_{PNi}$ is disposed directly adjacent to capacitor $C_{Pi}$. Capacitor $C_{NNi}$ and capacitor $C_{Ni}$ are controlled by the negative control signal $d_P$<i> and arranged on the other side of the second differential DAC output line Line$_n$. Capacitor $C_{NNi}$ is disposed directly adjacent to capacitor $C_{Ni}$. In the CDAC 250, when output voltage of one of the control buffers (e.g., $b_{Pi}$) is changed, the charge in the connected capacitor (e.g., $C_{Pi}$) may be redistributed among the other capacitors in the array (e.g., the remaining capacitors) and compensate for the voltage shift.

The capacitors $C_{Pi}$, $C_{PNi}$, and corresponding inverting buffer $b_{Pi}$ and the non-inverting buffer $b_{PNi}$ controlled by the same positive control input $d_P$<i> are placed on one side of the CDAC output line Line$_P$. Similarly, the capacitors $C_{Ni}$, $C_{NNi}$, and corresponding inverting buffer $b_{Ni}$ and the non-inverting buffer $b_{NNi}$ controlled by the same negative control input $d_N$<2> are placed on the other side of the CDAC output line Line$_N$. By arranging capacitors controlled by the same signal on the same side of the unit circuit, wiring connections between SAR logic circuit outputs (e.g., $d_P$<i>, $d_N$<i>) and control buffers (e.g., $b_{PNi}$, $b_{Pi}$, $b_{NNi}$, $b_{Ni}$) may be simplified. Thus, a compact CDAC may be made. In addition, CDAC input capacitances may be advantageously reduced to support high-speed SAR ADC implementation.

Figure 3A:
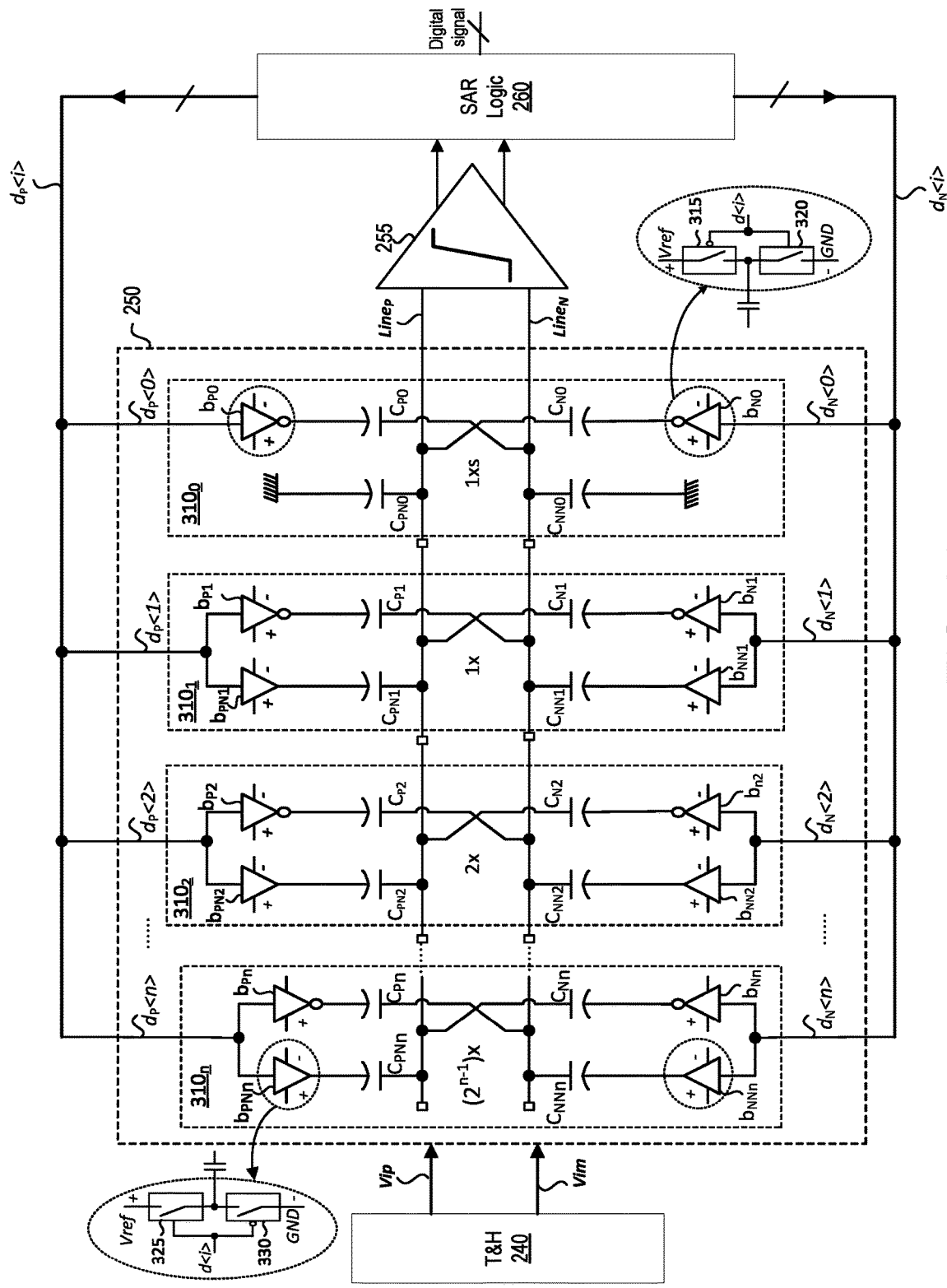
FIG. 3A depicts a schematic circuit diagram of an ADC with an exemplary DAC.

FIG. 3A depicts a schematic circuit diagram of an ADC with an exemplary DAC. In this depicted example, a DAC 250 is a differential CDAC. On each SA cycle, after the comparator system 255 takes its decision, the SAR logic circuit 260 may send a control signal to the CDAC 250. If the decision is positive, a corresponding positive control input $d_P<i>$ may change from low to high and a corresponding negative control input $d_N<i>$ may stay low. If the decision is negative, a corresponding positive control input $d_P<i>$ may stay low and a corresponding negative control input $d_N<i>$ may change from low to high.

The CDAC 250 includes two types of unit circuits. A first type of unit circuit is used for the least significant bit (LSB) and includes a unit circuit $310_0$. The unit circuit $310_0$ includes a first capacitor $C_{P0}$ with one terminal connected to a positive control input $d_P<0>$ through an inverting buffer $b_{P0}$, and the other terminal is connected to the CDAC output line $Line_N$. The unit circuit $310_0$ also includes a second capacitor $C_{N0}$ with one terminal connected to a negative control input $d_N<0>$ through another inverting buffer $b_{N0}$, and the other terminal is connected to the CDAC output line $Line_P$. The unit circuit $310_0$ also includes a third capacitor $C_{PN0}$, with one terminal connected to the CDAC output line $Line_P$ and the other terminal connected to, for example, ground potential. The unit circuit $310_0$ also includes a fourth capacitor $C_{NN0}$, with one terminal connected to the CDAC output line $Line_N$ and the other terminal connected to, for example, the ground. The capacitors $C_{PN0}$, $C_{NN0}$ may act as dummy capacitors on the resultant CDAC. As the action of $d_P<0>$ and $d_N<0>$ are transmitted to only one of the output lines (e.g., $Line_P$, $Line_N$), the output common mode may vary in plus or minus a half LSB when the control input rises from low to high.

A second type of unit circuits includes unit circuit $310_1$-$310_n$. Each of the unit circuits $310_1$-$310_n$ may keep with common mode constant and generate two LSBs of differential output voltage, when combined with the unit circuit $310_0$ to form a CDAC. Each of the capacitors (e.g., $C_{PNi}$, $C_{Ni}$, $C_{Pi}$, $C_{NNi}$) in the $i^{th}$ unit circuits $310_i$ (e.g., $310_1$-$310_n$) are arranged between a corresponding buffer (e.g., buffers $b_{PNi}$, $b_{Pi}$, $b_{NNi}$, $b_{Ni}$) and the CDAC output line (e.g., $Line_P$, $Line_N$), n≥i≥1. The capacitances in the N unit circuits (e.g., $310_1$-$310_n$) may be scaled by a factor of 2 (binary weighted CDAC). Each control input (e.g., $d_P<i>$, $d_N<i>$) is connected to both an inverting buffer (e.g., $b_{Ni}$, $b_{Pi}$) and a non-inverting buffer (e.g., $b_{NNi}$, $b_{PNi}$).

Switching of the capacitors in the unit circuits is performed through numerous switches in the buffers (e.g., $b_{PNi}$, $b_{Pi}$, $b_{NNi}$, $b_{Ni}$), which are controlled by control signals 256 (e.g., $d_P<i>$, $d_N<i>$) provided by the SAR logic circuit 260 in response to the comparator 255 outputs at each step pf the conversion process. When a positive control input $d_P<i>$ rises from low to high, a bottom plate voltage of the capacitor connected to the non-inverting buffer may be varied from ground (GND) to a reference voltage $V_{ref}$, and the positive line (e.g., $Line_P$) voltage change may be $$\Delta V_P = \frac{N(j) * C_u}{C_T} * V_{ref},$$

$C_T$ is the total capacitances connected to the CDAC output, $C_U$ is the capacitance of a unity capacitor, N(j) is the number of unity capacitors, j is the input index. For j>0, $N(j)=2^{j-1}$, and for j=0, N(j)=1. For the same positive control input $d_P<i>$ rise, the bottom plate voltage of the capacitor connected to the inverting buffer may be varied from $V_{ref}$ to GND, and the negative line (e.g., $Line_N$) voltage change may be $$\Delta V_N = \frac{-N(j) * C_u}{C_T} * V_{ref}.$$

Thus, by using this doubled DAC architecture, a common mode of the comparator system 255 inputs may be kept substantially constant during SAR operation. If, for example, switching $d_P<3>$ from 0 to 1 increases the voltage of $Line_N$ at one input of the comparator system 255, the voltage of $Line_P$ at the other input of the comparator system 255 may be decreased by the same amount. Thus, the common mode voltage at the comparator system 255 inputs may be kept substantially constant.

In this doubled DAC architecture, the arrangement of buffers and capacitors that are controlled by the same control input have been optimized. More specifically, buffers and capacitors that are controlled by the same control input are physically placed in one side of a CDAC output line. For example, unit circuit $310_2$ (e.g., 2× section) includes capacitors $C_{PN2}$, $C_{N2}$, $C_{P2}$, $C_{NN2}$ and buffers $b_{PN2}$, $b_{N2}$, $b_{P2}$, $b_{NN2}$. One terminal of the capacitor $C_{P2}$ is connected to the CDAC output line $Line_N$, the other terminal of the capacitor $C_{P2}$ is connected to an inverting buffer $b_{P2}$ to receive a positive control input $d_P<2>$. The positive control input $d_P<2>$ is also coupled to a capacitor $C_{PN2}$ through a non-inverting buffer $b_{PN2}$. The capacitors $C_{P2}$, $C_{PN2}$, and corresponding inverting buffer $b_{P2}$ and the non-inverting buffer $b_{PN2}$ controlled by the same positive control input $d_P<2>$ are placed on one side of the CDAC output line $Line_P$. The capacitors $C_{N2}$, $C_{NN2}$, and corresponding inverting buffer $b_{N2}$ and the non-inverting buffer $b_{NN2}$ controlled by the same negative control input $d_N<2>$ are placed on the other side of the CDAC output line $Line_N$. By changing the physical positions of the capacitors and buffers, wiring connections for inverting and non-inverting CDAC buffering may become a single path. Thus, wire capacitances may be advantageously reduced. A compact CDAC with a smaller footprint (e.g., size) may be then made. In addition, modular implementation of unit circuits may allow for unit circuits based layout/design and reduced mismatch related impairments.

A schematic structure of an exemplary inverting buffer used in the CDAC is also shown in FIG. 3A. The inverting buffer (e.g., $b_{N0}$-$b_{Nn}$, $b_{P0}$-$b_{Pn}$) is a complementary metal-oxide-semiconductor (CMOS) inverter and includes two switches connected in series. In this depicted example, one of the two switches may be a P-type metal-oxide-semiconductor field-effect-transistor (PMOSFET) 315, and the other may be an N-type metal-oxide-semiconductor field-effect-transistor (NMOSFET) 320. The gate terminals of the PMOSFET 315 and NMOSFET 320 may be controlled by a corresponding control input d<i> (e.g., $d_P<i>$, $d_N<i>$). The source of the PMOSFET 315 is coupled to a positive reference voltage $V_{ref}$, and the source of the NMOSFET 320 is connected to ground, for example. The drain of the PMOSFET 315 and the drain of the NMOSFET 320 are connected together to generate an inverted control input (e.g., inverted d<i>).

A schematic structure of an exemplary non-inverting buffer is also shown in FIG. 3A. The non-inverting buffer (e.g., $b_{PN1}$-$b_{PNn}$, $b_{NN1}$-$b_{NNn}$) includes two switches connected in series. In this depicted example, one of the two switches may be an NMOSFET 325, and the other may be a PMOSFET 330. The gate terminals of the NMOSFET 325 and the PMOSFET 330 may be controlled by a corresponding control input d<i> (e.g., $d_P<i>$, $d_N<i>$). The drain of the NMOSFET 325 is connected to a positive reference voltage, and the drain of the PMOSFET 330 is connected to ground, for example. The sources of the NMOSFET 325 and the PMOSFET 330 are connected together to generate a non-inverted control input (e.g., non-inverted d<i>). In some embodiments, the switches (control buffers) may be implemented by transmission gates to cope with a mid-range voltage level of a reference voltage.

Figure 3B:
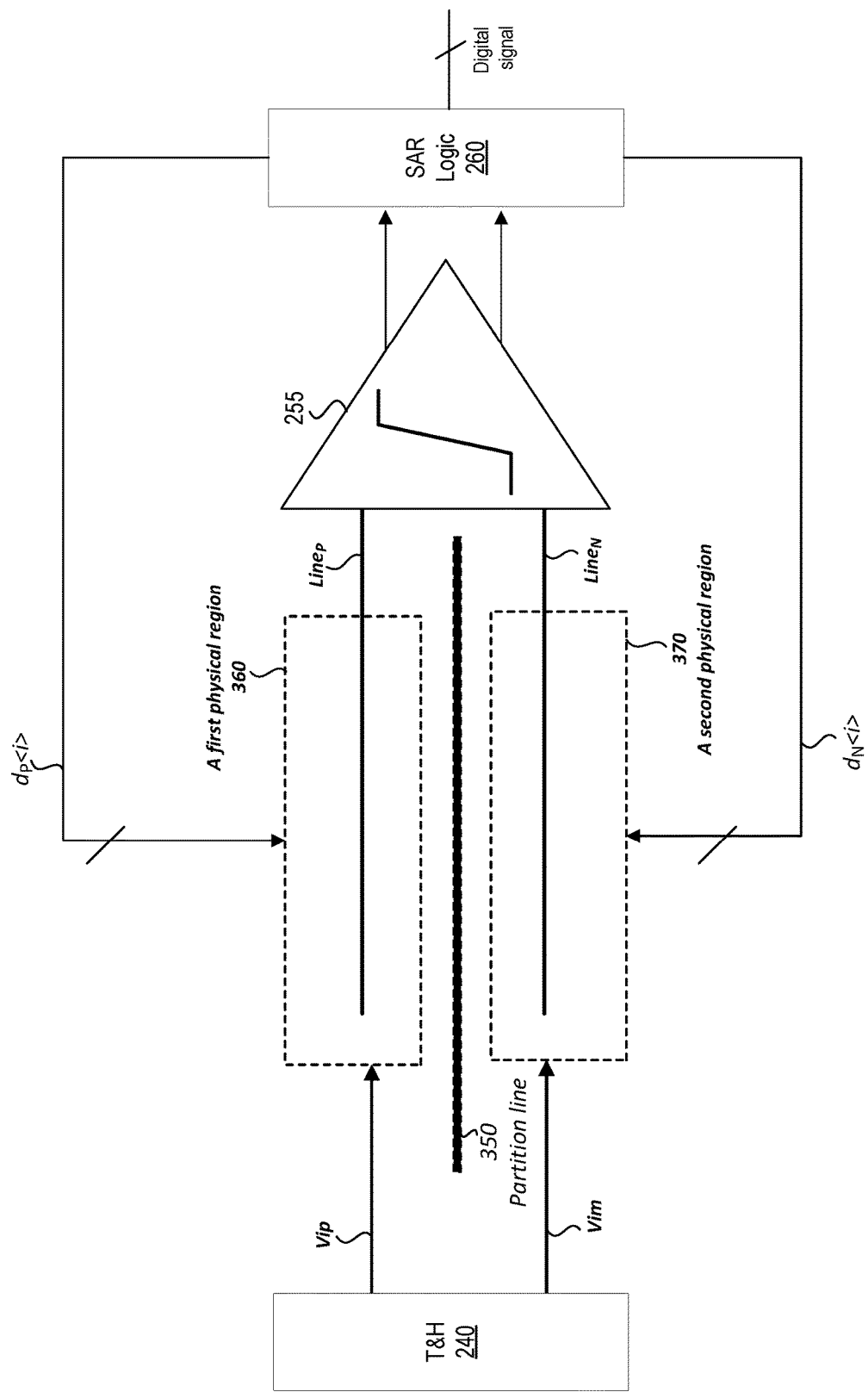
FIG. 3B depicts exemplary physical positions of buffers and/or capacitors in the DAC.

FIG. 3B depicts exemplary physical positions of buffers and/or capacitors in the DAC. In this schematic circuit, a partition line 350 is defined between the first conductive path $Line_P$ and the second conductive path $Line_N$. Accordingly, the partition line 350 defines two substantial coplanar regions lying in the same plane or two parallel planes lied in different layers of an integrated circuit.

In this depicted example, the partition line 350 defines a first physical region 360 and a second physical region 370. Buffers and/or capacitors controlled by the positive control input $d_P$<i> are placed on one side of the partition line 350, and buffers and/or capacitors controlled by the negative control input $d_N$<i> are placed on the other side of the partition line 350. Inverting buffers (e.g., $b_{Pi}$, $b_{Ni}$) and non-inverting buffers (e.g., $b_{PNi}$, $b_{NNi}$) controlled by a same control input (e.g., $d_N$<i>) are physically arranged adjacent to receive the same control input (e.g., $d_N$<i>). Thus, the routings from the SAR logic 260 to buffers and/or capacitors in the first physically region 360 may be crossed with routings from the SAR logic 260 to buffers and/or capacitors in the second physically region 370. Thus, input wire capacitances of the DAC may be advantageously reduced. The positions of the SAR logic circuit 260 may be also arranged in different physical places to further reduce wire lengths to obtain a reduced wire capacitance.

In some embodiments, only buffers are arranged in the first physical region 360 or the second physical region 370, the positions of capacitors in the DAC 250 may be arranged out of the corresponding first physical region 360 or the second physical region 370. For example, for the unit circuit $310_1$, the buffers $b_{P1}$ and $b_{PN1}$, and the capacitor $C_{PN1}$ may be arranged in the first physical region 360, the capacitor $C_{P1}$ may be arranged in the second physical region 370.

FIG. 4A depicts one type of an exemplary quad unit circuit implemented in the DAC. A second type of quad unit circuit 400A (e.g., $310_1$-$310_n$) includes capacitors $C_{PNi}$, $C_{Ni}$, $C_{Pi}$, $C_{NNi}$ and buffers $b_{PNi}$, $b_{Ni}$, $b_{Pi}$, $b_{NNi}$. One terminal of the capacitor $C_{Pi}$ is connected to the CDAC output line $Line_N$, the other terminal of the capacitor $C_{Pi}$ is connected to an inverting buffer $b_{Pi}$ to receive a positive control input $d_P$<i>. The positive control input $d_P$<i> is also coupled to a capacitor $C_{PNi}$ through a non-inverting buffer $b_{PNi}$. The capacitors $C_{Pi}$, $C_{PNi}$, and corresponding inverting buffer $b_{Pi}$ and the non-inverting buffer $b_{PNi}$ controlled by the same positive control input $d_P$<i> are placed on one side of the CDAC output line $Line_P$. Wire $W_{Pi}$ is used to connect the inverting buffer $b_{Pi}$ and the capacitor $C_{Pi}$. Wire $W_{PNi}$ is used to connect the buffer $b_{PNi}$ and the capacitor $C_{PNi}$.

The capacitors $C_{Ni}$, $C_{NNi}$, and corresponding inverting buffer $b_{Ni}$ and the non-inverting buffer $b_{NNi}$ controlled by the same negative control input $d_N$<i> are placed on the other side of the CDAC output line $Line_N$. Wire $W_{Ni}$ is used to connect the inverting buffer $b_{Ni}$ and the capacitor $C_{Ni}$. Wire $W_{NNi}$ is used to connect the inverting buffer $b_{Pi}$ and the capacitor $C_{Ni}$. By changing the physical positions of the capacitors and buffers, routing between the SAR logic circuit 255 and the CDAC 250 may be optimized to make wiring connections for inverting and non-inverting CDAC buffering be a single path instead of two paths. Wire capacitances of the CDAC implementing unit circuit 400A may be half of the wire capacitances of the CDAC which doesn't consider the arrangement of capacitors and buffers in the unit circuit. Thus, wire capacitances of the CDAC may be advantageously reduced to support high-speed SAR ADCs.

FIG. 4B depicts an exemplary layout 400B of the second type of quad unit circuit. In this depicted example, a capacitor quad unit circuit (e.g., unit circuit 400A) is implemented as a fringe capacitor. Vertical metal bars $Line_N$ and $Line_P$ may be shared between two adjacent unit circuits. The capacitance between the vertical $Line_P$ bar and the wire $W_{PNi}$ bar form the $C_{PNi}$ capacitor. The capacitance between the vertical $Line_N$ bar and the wire $W_{Pi}$ bar form the $C_{Pi}$ capacitor. The buffers $b_{Pi}$ and $b_{PNi}$ may be arranged between the wire $W_{PNi}$ bar and the wire $W_{Pi}$ bar. The capacitance between the vertical $Line_P$ bar and the wire $W_{Ni}$ bar form the $C_{Ni}$ capacitor. The capacitance between the vertical $Line_N$ bar and the wire $W_{NNi}$ bar form the $C_{NNi}$ capacitor. The buffers $b_{NNi}$ and $b_{Ni}$ may be arranged between the wire $W_{NNi}$ bar and the wire $W_{Ni}$ bar. As the limitations for the unit circuit width may be the minimum metallization pitch (for the capacitors) and the buffer width, this implementation may be made more compact. This layout may be scalable, due to digital implementation style of the buffers.

In some embodiments, the fringe capacitor structure may be replaced by an alternative structure with wire metals (buffer output bar) (e.g., $W_{NNi}$ $W_{Ni}$ $W_{Pi}$ $W_{PNi}$) wrapped around the $Line_P$ bar and the $Line_N$ bar to provide a more compact capacitor implementation. In some embodiments, the fringe capacitor structure may be replaced by another alternative structure with the horizontal positions of the $Line_P$ bar and the $Line_N$ bar and wire metals, which may advantageously reduce parasitic capacitances between the buffer outputs. In some embodiments, instead of scaling the number of the quad unit circuits to increase the number of bits between two sections, the length of the fringe capacitor may be scaled to obtain narrower total CDAC width and taller CDAC implementation.

Figure 4C:
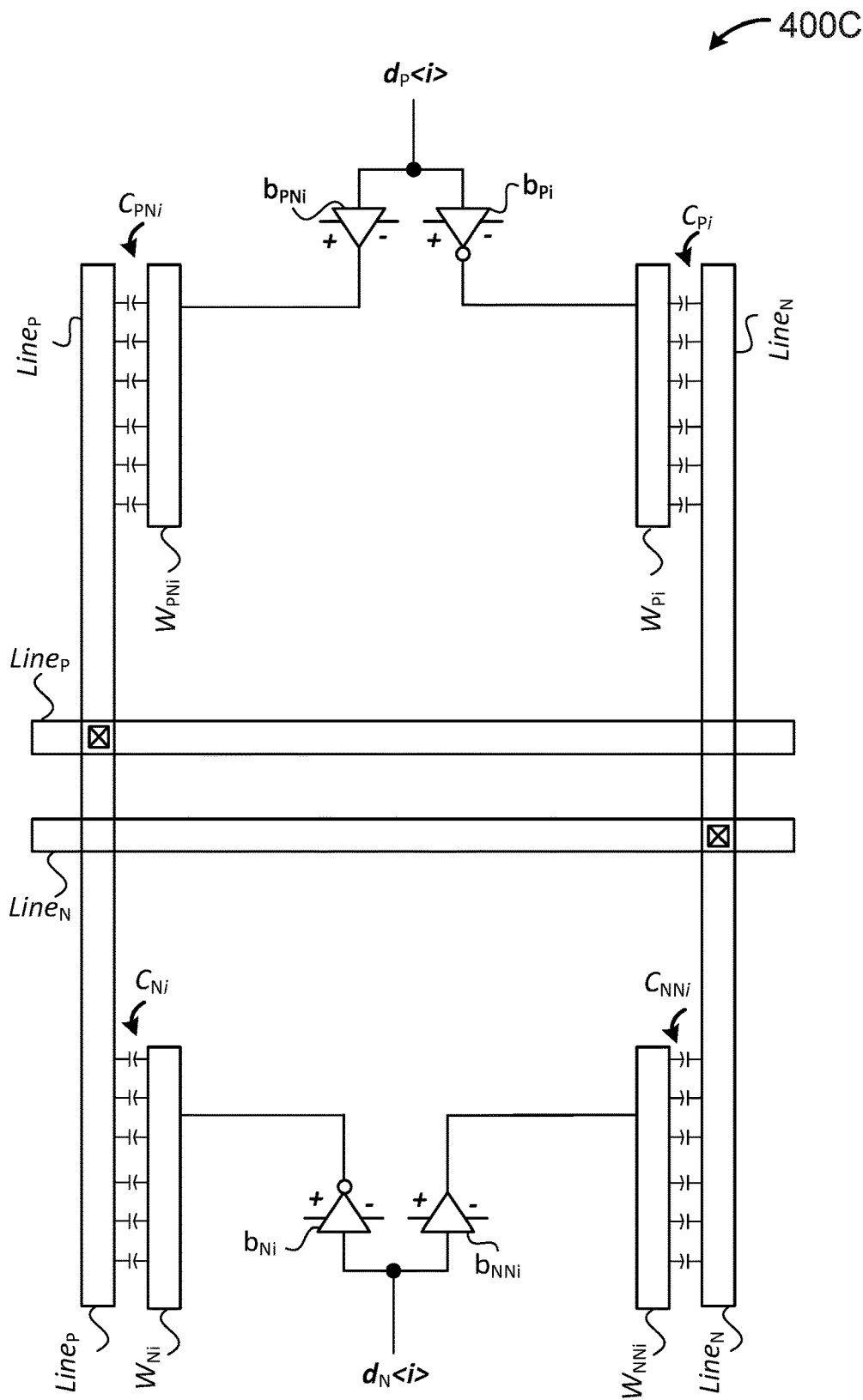
FIG. 4C depicts an exemplary arrangement of buffers in the layout of wires.

FIG. 4C depicts an exemplary arrangement 400C of buffers in the layout of wires. In this depicted example, the buffers $b_{PNi}$ and $b_{Pi}$ are arranged between the wire $W_{PNi}$ bar and the wire $W_{Pi}$ bar to receive the control input $d_P$<i>. The buffers $b_{NNi}$ and $b_{Ni}$ are arranged between the wire $W_{NNi}$ bar and the wire $W_{Ni}$ bar to receive the control input $d_N$<i>. This kind of arrangement may advantageously reduce the layout area of the quad unit circuit 400A. In some embodiments, the buffers $b_{PNi}$, $b_{Pi}$, $b_{NNi}$, and $b_{Ni}$ may be arranged in other places to meet different design requirements.

Figure 5:
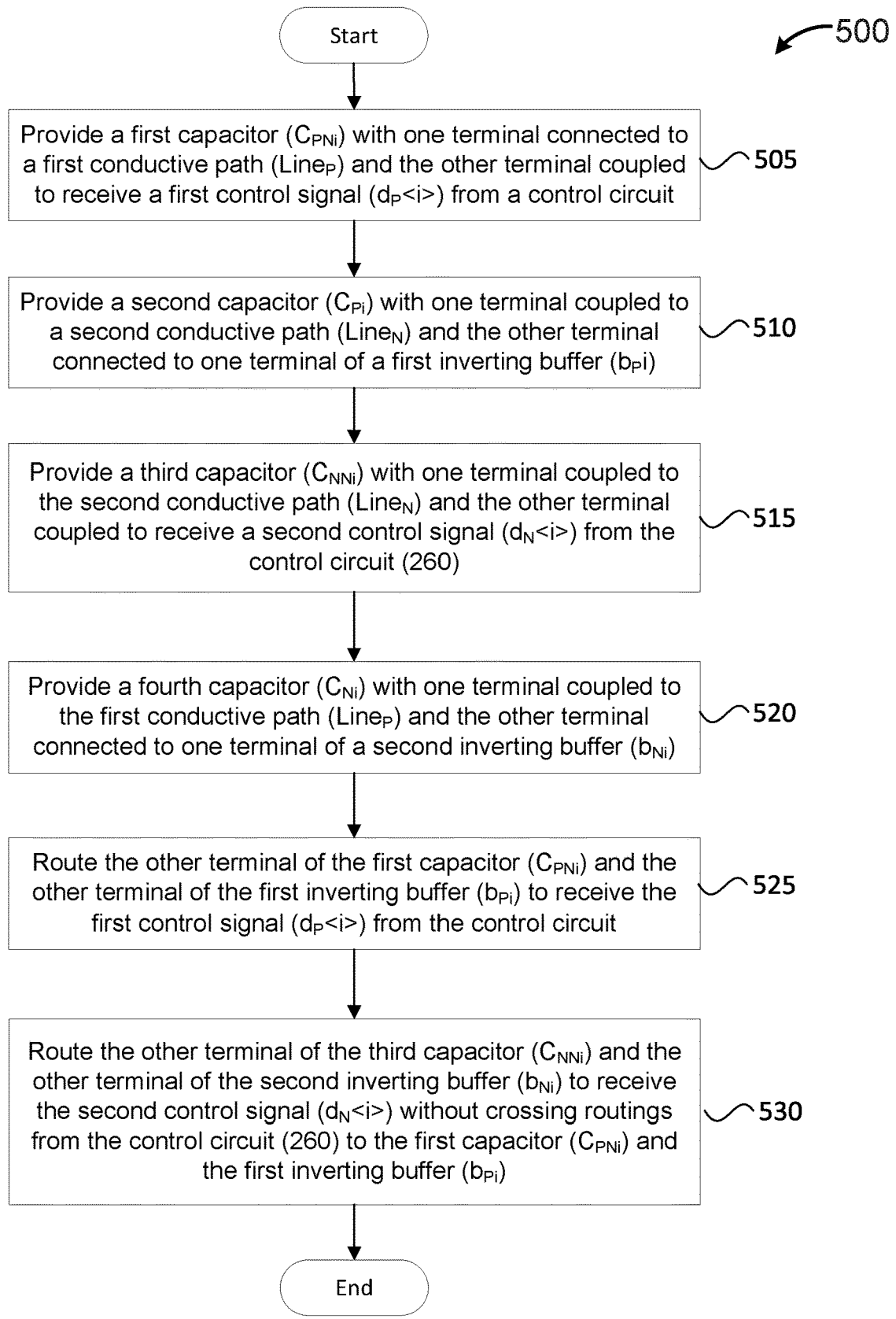
FIG. 5 depicts a flow chart of an exemplary method to implement the quad unit circuit.

FIG. 5 depicts a flow chart of an exemplary method to implement the quad unit circuit. A method 500 represents exemplary operations that may be performed to implement the quad unit circuit 400A described with reference to FIG. 4A. The method 500 includes, at 505, providing a first capacitor (e.g., $C_{PNi}$) with one terminal coupled to a first conductive path (e.g., $Line_P$) and the other terminal coupled to receive a first control signal (e.g., $d_P$<i>) from a control circuit (e.g., SAC logic 260). The method 500 also includes, at 510, providing a second capacitor (e.g., $C_{Pi}$) with one terminal coupled to a second conductive path (e.g., $Line_N$) and the other terminal connected to one terminal of a first inverting buffer (e.g., $b_{Pi}$).

The method 500 also includes, at 515, providing a third capacitor (e.g., $C_{NNi}$) with one terminal coupled to the second conductive path (e.g., $Line_N$) and the other terminal coupled to receive a second control signal (e.g., $d_N$<i>) from the control circuit 260. The method 500 also includes, at 520, providing a fourth capacitor (e.g., $C_{Ni}$) with one terminal coupled to the first conductive path (e.g., Line$_P$) and the other terminal connected to one terminal of a second inverting buffer (e.g., b$_{Ni}$).

The method 500 also includes, at 525, routing the other terminal of the first capacitor C$_{PNi}$ and the other terminal of the first inverting buffer b$_{Pi}$ to receive the first control signal d$_P$<i> from the control circuit 260. The method 500 also includes, at 530, routing the other terminal of the third capacitor C$_{NNi}$ and the other terminal of the second inverting buffer b$_{Ni}$ to receive the second control signal d$_N$<i> without crossing routings from the control circuit 260 to the first capacitor C$_{PNi}$ and the first inverting buffer b$_{Pi}$. By arranging the positions of the capacitors and/or buffers in the unit circuit 400A, wire capacitances may be advantageously reduced. A compact CDAC with a smaller footprint (e.g., size) may be then made. In addition, modular implementation of unit circuits may allow for unit circuits based layout/design and reduced mismatch related impairments.

Figure 6:
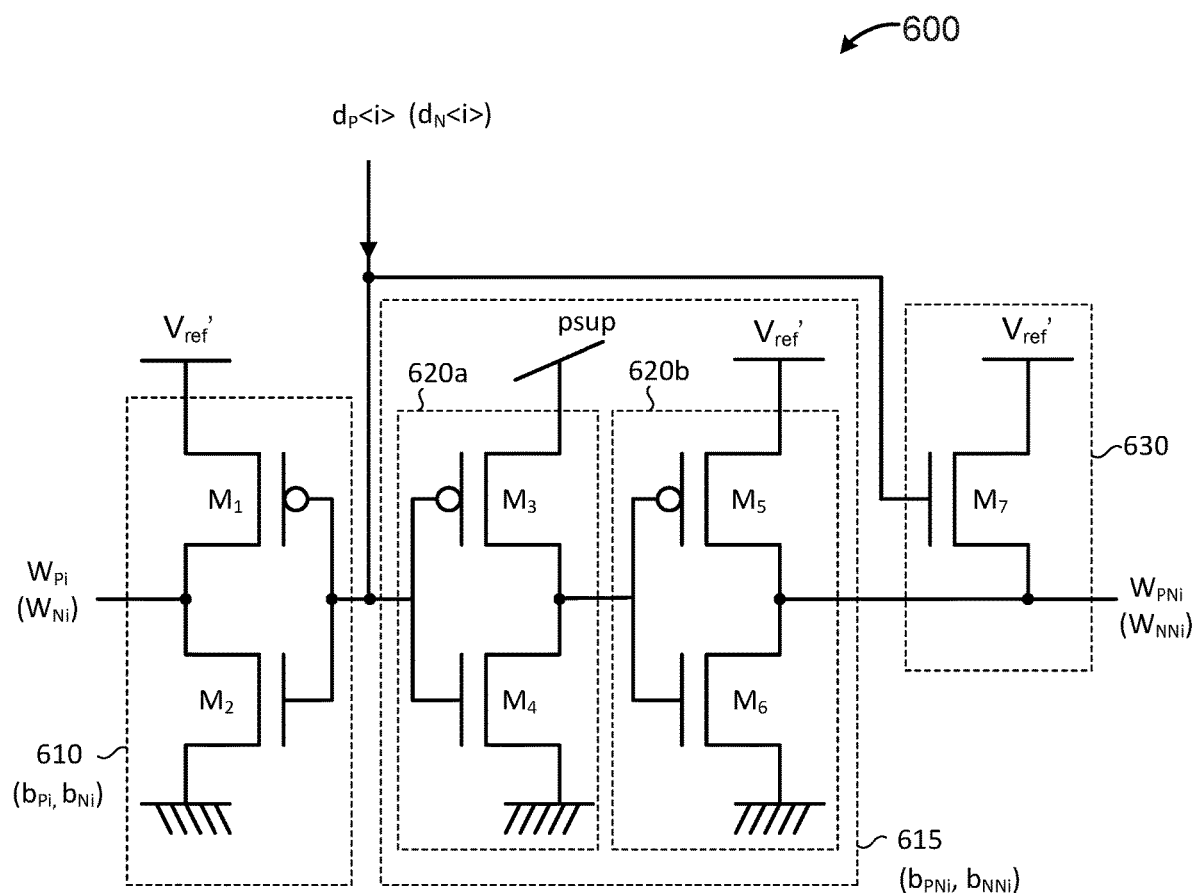
FIG. 6 depicts an architecture of an exemplary integrated buffer structure in the quad unit circuit.

FIG. 6 depicts an architecture of an exemplary integrated buffer structure in the quad unit circuit. As shown in FIG. 4A, the non-inverting buffer b$_{PNi}$ and the inverting buffer b$_{Pi}$ receive the same control input d$_P$<i>. Similarly, the non-inverting buffer b$_{NNi}$ and the inverting buffer b$_{Ni}$ receive the same control input d$_N$<i>. An integrated buffer 600, implemented as a single cell, includes an inverter 610 (e.g., b$_{Pi}$ or b$_{Ni}$) and a non-inverter 615 (e.g., b$_{PNi}$ or b$_{NNi}$). In this depicted example, the inverter buffer 610 is a CMOS inverter having a PMOSFET M$_1$ and an NMOSFET M$_2$. The source of the PMOSFET M$_1$ is coupled to another reference voltage V$_{ref}$'. The source of the NMOSFET M$_2$ is coupled to GND, for example. The gate of the PMOSFET M$_1$ and the gate of the NMOSFET M$_2$ are coupled together to receive the control input d$_P$<i> or d$_N$<i>. The drain of the PMOSFET M$_1$ is connected to the drain of the NMOSFET M$_2$. The output of the inverter 610 is connected to a corresponding capacitor through a corresponding wire (e.g., W$_{Pi}$, W$_{Ni}$).

The non-inverter 615 also includes a number of transistors. In this depicted example, the non-inverter 615 is achieved by connecting two CMOS inverters in series. More specifically, the non-inverter 615 includes a first CMOS inverter 620a which includes a PMOSFET M$_3$ and an NMOSFET M$_4$. The source of the PMOSFET M$_3$ is coupled to power supply PSUP. The source of the NMOSFET M$_4$ is coupled to GND, for example. The gate of the PMOSFET M$_3$ and the gate of the NMOSFET M$_4$ are coupled together to receive the control input d$_P$<i> or d$_N$<i>. The drain of the PMOSFET M$_3$ is connected to the drain of the NMOSFET M$_4$.

The non-inverter 615 also includes a second CMOS inverter 620b which includes a PMOSFET M$_5$ and an NMOSFET M$_6$. The gate of the PMOSFET M$_5$ and the gate of the NMOSFET M$_6$ are coupled together to receive the output of the first CMOS inverter 620a. The source of the PMOSFET M$_5$ is coupled to the reference voltage V$_{ref}$'. The source of the NMOSFET M$_7$ is coupled to GND, for example. The drain of the PMOSFET M$_5$ is connected to the drain of the NMOSFET M$_6$ to generate a non-inverted output to a corresponding capacitor through a corresponding wire (e.g., W$_{Pi}$, W$_{Ni}$). In some embodiments, the power supply PSUP may have a voltage that is greater than or equal to the reference voltage V$_{ref}$'. Thus, the first CMOS inverter 620a may be faster than other inverters in the integrated buffer 600. The delay from the input to the non-inverting output (output of non-inverter 615) may be about the double of the delay between the input and the inverting output (output of inverter 610).

The integrated buffer 600 also includes a speed-boosting device 630. In this depicted example, the speed-boosting device 630 is an NMOSFET M$_7$. The gate of the NMOSFET M$_7$ is coupled to receive the control input d$_P$<i> or d$_N$<i>. The drain of the NMOSFET M$_7$ is coupled to the reference voltage V$_{ref}$', and the source of the NMOSFET M$_7$ is coupled to the output of the second CMOS inverter 620b. The transistor M$_7$ may start the charging of the non-inverted output during the transition period of the first CMOS inverter 620a and advantageously reduce the delay on the non-inverting path.

In some embodiments, the inverter 610 may be omitted and the integrated buffer 600 may only include the non-inverter 615. And the output of the first CMOS inverter 620a may be connected to a corresponding capacitor through a corresponding wire (e.g., W$_{Pi}$, W$_{Ni}$). In some embodiments, the size of the transistors M$_1$-M$_7$ may be different. For example, the size of transistor M$_1$-M$_4$, and transistor M$_6$-M$_7$ may be the same. The size of transistor M$_5$ may be, for example, two times the size of transistor M$_1$. If size of transistor M$_5$ is bigger, then the ON resistance of the transistor M$_5$ may be smaller and the rising time at the output of the transistor M$_5$ may be faster. And the first CMOS inverter 620a may have extra power.

Although various embodiments have been described with reference to the figures, other embodiments are possible. For example, in some embodiments, the quad unit circuits in the CDAC 250 may be divided into two types of dual cells with one type containing inverting buffers only and the other type containing non-inverting buffers only. In some embodiments, the quad unit circuits in the CDAC 250 may be divided into dual cells with each containing an inverting buffer and a non-inverting buffer to substantially reduce or eliminate crossings between Line$_P$ and Line$_N$. In some embodiments, instead of using two types of unit circuits, the CDAC 250 may only include the second type of unit circuits 310$_1$-310$_n$. In some embodiments, instead of using two types of unit circuits, the CDAC 250 may only include a variation of the second type of unit circuits 310$_1$-310$_n$. The variation of the second type of unit circuits may only include inverting buffers. In some embodiments, the CDAC 250 may be modified to include capacitance mismatch calibration circuit. Extra quad unit circuits may be added to the biggest capacitor banks in the array, and extra switches may be added to a calibration quad unit circuit control path. Thus, high-resolution ADC implementations (e.g., 12 bits, for example) may be obtained.

In some embodiments, the CDAC 250 may be arranged on the same integrated circuit (e.g., IC 215) with the SAR logic circuit 260. In another embodiment, the CDAC 250 may be implemented in a different integrated circuit (e.g., another FPGA) to perform the digital-to-analog conversion. In some embodiments, the CDAC 250 may be implemented as hard block fixed circuitry. For example, an application specific integrated circuit (ASIC) may provide a CDAC with customized hardware circuitry. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

In some embodiments, some or all of the functions of the CDAC 250 may be implemented in a processor that is configured to execute a set of instructions stored in a data store to control the signal conversion. The processor may be arranged on the same integrated circuit, which may be an FPGA with the DSP 235. For example, the CDAC 250 and the data store may be implemented in a programmable logic block of a system-on-chip (SOC) or implemented in a hard block using fixed circuitry of the SOC, and the DSP 235 may be implemented in another hard block using, for example, fixed circuitry (e.g., processor system (PS)) of the SOC. An exemplary architecture for a system-on-chip (SOC) type of integrated circuit is shown in FIG. 7.

Figure 7:
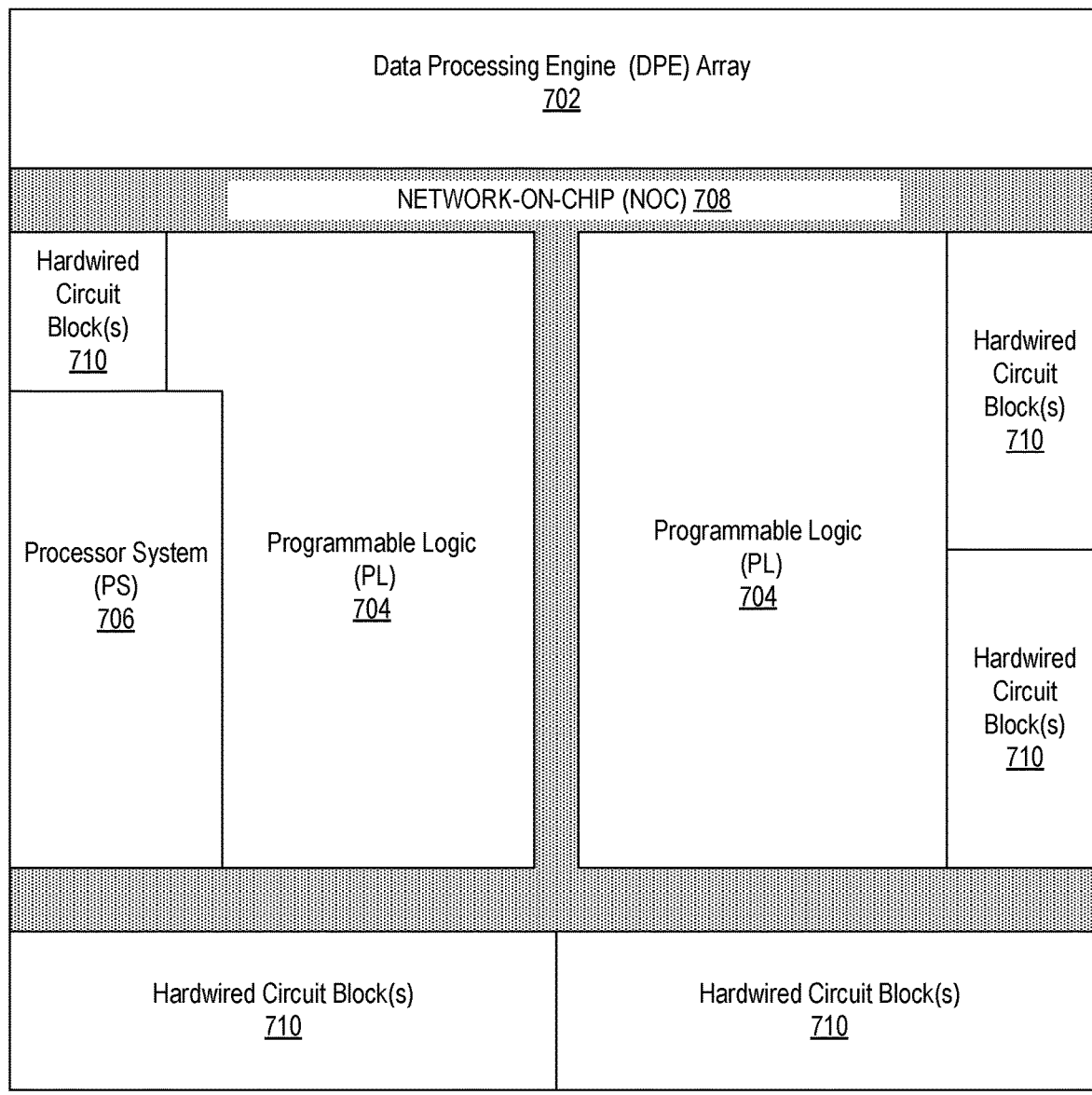
FIG. 7 illustrates an example architecture for a System-on-Chip (SOC) type of integrated circuit (IC).

FIG. 7 illustrates an example architecture for a System-on-Chip (SOC) 700. SOC 700 is an example of a programmable IC and an integrated programmable device platform. In the example of FIG. 7, the various, different subsystems or regions of the SOC 700 illustrated may be implemented on a single die provided within a single integrated package. In other examples, the different subsystems may be implemented on a plurality of interconnected dies provided as a single, integrated package.

In the example, the SOC 700 includes a plurality of regions having circuitry with different functionalities. In the example, the SOC 700 optionally includes a data processing engine (DPE) array 702. SOC 700 includes programmable logic (PL) regions 704 (hereafter PL region(s) or PL), a processing system (PS) 706, a Network-on-Chip (NOC) 708, and one or more hardwired circuit blocks 710. DPE array 702 is implemented as a plurality of interconnected, hardwired, and programmable processors having an interface to the other regions of the SOC 700.

PL 704 is circuitry that may be programmed to perform specified functions. As an example, PL 704 may be implemented as field programmable gate array type of circuitry. PL 704 can include an array of programmable circuit blocks. Examples of programmable circuit blocks within PL 704 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 704 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 706 is implemented as hardwired circuitry that is fabricated as part of the SOC 700. The PS 706 may be implemented as, or include, any of a variety of different processor types each capable of executing program code. For example, PS 706 may be implemented as an individual processor, e.g., a single core capable of executing program code. In another example, PS 706 may be implemented as a multicore processor. In still another example, PS 706 may include one or more cores, modules, co-processors, interfaces, and/or other resources. PS 706 may be implemented using any of a variety of different types of architectures. Example architectures that may be used to implement PS 706 may include, but are not limited to, an ARM processor architecture, an x86 processor architecture, a GPU architecture, a mobile processor architecture, a DSP architecture, or other suitable architecture that is capable of executing computer-readable instructions or program code.

NOC 708 includes an interconnecting network for sharing data between endpoint circuits in SOC 700. The endpoint circuits can be disposed in DPE array 702, PL regions 704, PS 706, and/or in hardwired circuit blocks 710. NOC 708 can include high-speed data paths with dedicated switching. In an example, NOC 708 includes horizontal paths, vertical paths, or both horizontal and vertical paths. The arrangement and number of regions shown in FIG. 7 is merely an example. The NOC 708 is an example of the common infrastructure that is available within the SOC 700 to connect selected components and/or subsystems.

NOC 708 provides connectivity to PL 704, PS 706, and to selected ones of the hardwired circuit blocks 710. NOC 708 is programmable. In the case of a programmable NOC used with other programmable circuitry, the nets that are to be routed through NOC 708 are unknown until a user circuit design is created for implementation within the SOC 700. NOC 708 may be programmed by loading configuration data into internal configuration registers that define how elements within NOC 708 such as switches and interfaces are configured and operate to pass data from switch to switch and among the NOC interfaces.

NOC 708 is fabricated as part of the SOC 700 and while not physically modifiable, may be programmed to establish connectivity between different master circuits and different slave circuits of a user circuit design. NOC 708, for example, may include a plurality of programmable switches that are capable of establishing packet switched network connecting user specified master circuits and slave circuits. In this regard, NOC 708 is capable of adapting to different circuit designs, where each different circuit design has different combinations of master circuits and slave circuits implemented at different locations in the SOC 700 that may be coupled by NOC 708. NOC 708 may be programmed to route data, e.g., application data and/or configuration data, among the master and slave circuits of the user circuit design. For example, NOC 708 may be programmed to couple different user-specified circuitry implemented within PL 704 with PS 706, and/or DPE array 702, with different hardwired circuit blocks, and/or with different circuits and/or systems external to the SOC 700.

The hardwired circuit blocks 710 may include input/output (I/O) blocks, and/or transceivers for sending and receiving signals to circuits and/or systems external to SOC 700, memory controllers, or the like. Examples of different I/O blocks may include single-ended and pseudo differential I/Os and high-speed differentially clocked transceivers. Further, the hardwired circuit blocks 710 may be implemented to perform specific functions. Examples of hardwired circuit blocks 710 include, but are not limited to, cryptographic engines, digital-to-analog converters, analog-to-digital converters, and the like. The hardwired circuit blocks 710 within the SOC 700 may be referred to herein from time-to-time as application-specific blocks.

In the example of FIG. 7, PL 704 is shown in two separate regions. In another example, PL 704 may be implemented as a unified region of programmable circuitry. In still another example, PL 704 may be implemented as more than two different regions of programmable circuitry. The particular organization of PL 704 is not intended as a limitation. In this regard, SOC 700 includes one or more PL regions 704, PS 706, and NOC 708. DPE array 702 may be optionally included.

In other example implementations, the SOC 700 may include two or more DPE arrays 702 located in different regions of the IC. In still other examples, the SOC 700 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit, comprising:
   a first capacitor having two terminals, with one terminal coupled to a first conductive path and the other terminal coupled to receive a first control signal from a control circuit;
   a second capacitor having a first terminal and a second terminal, the first terminal of the second capacitor is coupled to a second conductive path and the second terminal of the second capacitor is connected to a terminal of a first inverting buffer, the other terminal of the first inverting buffer ($b_{Pi}$) is coupled to receive the first control signal from the control circuit;
   a third capacitor having two terminals, with one terminal coupled to the second conductive path and the other terminal coupled to receive a second control signal from the control circuit; and,
   a fourth capacitor having a first terminal and a second terminal, the first terminal of the fourth capacitor is coupled to the first conductive path and the second terminal of the fourth capacitor is connected to a terminal of a second inverting buffer ($b_{Ni}$), the other terminal of second inverting buffer is coupled to receive the second control signal from the control circuit,
   wherein, routings from the control circuit to the first capacitor and the first inverting buffer ($b_{Pi}$) are routed without crossing routings from the control circuit to the third capacitor and the second inverting buffer.

2. The circuit of claim 1, wherein the first capacitor is configured to receive the first control signal through a first non-inverting buffer, the first non-inverting buffer is physically arranged adjacent to the first inverting buffer.

3. The circuit of claim 2, wherein the first non-inverting buffer and the first inverting buffer are provided by an integrated buffer circuit, the integrated buffer circuit comprises:
   a first complementary metal-oxide-semiconductor (CMOS) inverter coupled to receive the first control signal;
   a second CMOS inverter coupled to receive the first control signal;
   a third CMOS inverter configured to receive an output of the second CMOS inverter.

4. The circuit of claim 3, wherein the integrated buffer circuit further comprises an N-type metal-oxide-semiconductor field-effect-transistor (NMOSFET), a gate terminal of the NMOSFET is coupled to receive the first control signal, a drain terminal of the NMOSFET is coupled to a reference voltage, and a source terminal of the NMOSFET is coupled to an output of the third CMOS inverter.

5. The circuit of claim 3, wherein the second CMOS inverter is powered by a supply voltage that is greater than a supply voltage of first CMOS inverter.

6. The circuit of claim 3, wherein the size of the third CMOS inverter is larger than the size of the second CMOS inverter.

7. The circuit of claim 1, wherein the third capacitor is configured to receive the second control signal through a second non-inverting buffer, the second non-inverting buffer is physically arranged adjacent to the second inverting buffer.

8. The circuit of claim 7, wherein the second non-inverting buffer and the second inverting buffer are provided by an integrated buffer circuit.

9. A system, comprising:
a plurality of a first type of unit circuits, wherein, each unit circuit of the plurality of a first type of unit circuits comprising:
a first capacitor having two terminals, with one terminal coupled to a first conductive path and the other terminal coupled to receive a first control signal from a control circuit;
a second capacitor having a first terminal and a second terminal, the first terminal of the second capacitor is coupled to a second conductive path and the second terminal of the second capacitor is connected to a terminal of a first inverting buffer, the other terminal of the first inverting buffer is coupled to receive the first control signal from the control circuit;
a third capacitor having two terminals, with one terminal coupled to the second conductive path and the other terminal coupled to receive a second control signal from the control circuit; and,
a fourth capacitor having a first terminal and a second terminal, the first terminal of the fourth capacitor is coupled to the first conductive path and the second terminal of the fourth capacitor is connected to a terminal of a second inverting buffer, the other terminal of second inverting buffer is coupled to receive the second control signal from the control circuit,
wherein, routings from the control circuit to the first capacitor and the first inverting buffer are routed without crossing routings from the control circuit to the third capacitor and the second inverting buffer.

10. The system of claim 9, wherein the first capacitor is configured to receive the first control signal through a first non-inverting buffer, the first non-inverting buffer is physically arranged adjacent to the first inverting buffer.

11. The system of claim 10, wherein the first non-inverting buffer and the first inverting buffer are provided by an integrated buffer circuit, the integrated buffer circuit comprises:
a first complementary metal-oxide-semiconductor (CMOS) inverter coupled to receive the first control signal;
a second CMOS inverter coupled to receive the first control signal; and,
a third CMOS inverter configured to receive an output of the second CMOS inverter.

12. The system of claim 11, wherein the integrated buffer circuit further comprises an N-type metal-oxide-semiconductor field-effect-transistor (NMOSFET), a gate terminal of the NMOSFET is coupled to receive the first control signal, a drain terminal of the NMOSFET is coupled to a reference voltage, and a source terminal of the NMOSFET is coupled to an output of the third CMOS inverter.

13. The system of claim 11, wherein the second CMOS inverter is powered by a supply voltage that is greater than a supply voltage of first CMOS inverter.

14. The system of claim 11, wherein the third capacitor is configured to receive the second control signal through a second non-inverting buffer, the second non-inverting buffer is physically arranged adjacent to the second inverting buffer.

15. The system of claim 11, further comprising: a second type of unit circuit, wherein the second type of unit circuit comprising:
a fifth capacitor having two terminals, with one terminal coupled to the first conductive path and the other terminal coupled to ground;
a sixth capacitor having two terminals, with one terminal coupled to the second conductive path and the other terminal connected to a third control signal through a sixth inverting buffer;
a seventh capacitor having two terminals, with one terminal coupled to the second conductive path and the other terminal coupled to ground; and,
an eighth capacitor having two terminals, with one terminal coupled to the first conductive path and the other terminal connected to a fourth control signal through an eighth inverting buffer,
wherein, the fifth capacitor and the sixth capacitor are arranged on a same side of the first conductive path ($Line_P$), the seventh capacitor and the eighth capacitor are arranged on a same side of the second conductive path.

16. A method, comprising:
providing a first capacitor with one terminal coupled to a first conductive path ($Line_P$) and the other terminal coupled to receive a first control signal from a control circuit;
providing a second capacitor with one terminal coupled to a second conductive path and the other terminal connected to one terminal of a first inverting buffer;
providing a third capacitor with one terminal coupled to the second conductive path and the other terminal coupled to receive a second control signal from the control circuit;
providing a fourth capacitor with one terminal coupled to the first conductive path and the other terminal connected to one terminal of a second inverting buffer;
routing the other terminal of the first capacitor and the other terminal of the first inverting buffer to receive the first control signal; and,
routing the other terminal of the third capacitor and the other terminal of the second inverting buffer to receive the second control signal without crossing routings from the control circuit to the first capacitor and the first inverting buffer.

17. The method of claim 16, further comprising:
physically arranging a first non-inverting buffer adjacent to the first inverting buffer and coupling one terminal of the first capacitor to the first control signal through a first non-inverting buffer.

18. The method of claim 17, wherein the first non-inverting buffer and the first inverting buffer are provided by an integrated buffer circuit, the integrated buffer circuit comprises:
a first complementary metal-oxide-semiconductor (CMOS) inverter coupled to receive the first control signal;
a second CMOS inverter coupled to receive the first control signal; and,
a third CMOS inverter configured to receive an output of the second CMOS inverter.

19. The method of claim 18, wherein the integrated buffer circuit further comprises an N-type metal-oxide-semiconductor field-effect-transistor (NMOSFET), a gate terminal of the NMOSFET is coupled to receive the first control signal, a drain terminal of the NMOSFET is coupled to a reference voltage, and a source terminal of the NMOSFET is coupled to an output of the third CMOS inverter.

20. The method of claim 18, wherein the second CMOS inverter is powered by a supply voltage (PSUP) that is greater than a supply voltage of first CMOS inverter.

* * * * *